(12) United States Patent
Garside et al.

(10) Patent No.: US 11,521,844 B2
(45) Date of Patent: Dec. 6, 2022

(54) ION CONFINEMENT DEVICE

(71) Applicant: Micromass UK Limited, Wilmslow (GB)

(72) Inventors: John Garside, Uppermill (GB); Kenneth Worthington, Middlewich (GB)

(73) Assignee: Micromass UK Limited, Wilmslow (GB)

( * ) Notice: Subject to any disclaimer, the term of this patent is extended or adjusted under 35 U.S.C. 154(b) by 80 days.

(21) Appl. No.: 16/979,068

(22) PCT Filed: Mar. 11, 2019

(86) PCT No.: PCT/GB2019/050668
§ 371 (c)(1),
(2) Date: Sep. 8, 2020

(87) PCT Pub. No.: WO2019/171085
PCT Pub. Date: Sep. 12, 2019

(65) Prior Publication Data
US 2020/0411302 A1 Dec. 31, 2020

(30) Foreign Application Priority Data
Mar. 9, 2018 (GB) ..................................... 1803773

(51) Int. Cl.
*H01J 49/06* (2006.01)
*G01N 27/622* (2021.01)
(Continued)

(52) U.S. Cl.
CPC .......... *H01J 49/062* (2013.01); *G01N 27/622* (2013.01); *H01J 37/32174* (2013.01);
(Continued)

(58) Field of Classification Search
CPC ........ H01J 49/062; H01J 49/022; H01J 49/24; H01J 49/422; H01J 49/065; H01J 49/4235;
(Continued)

(56) References Cited

U.S. PATENT DOCUMENTS 7,221,251 B2    5/2007   Menegoli et al.
2009/0302216 A1  12/2009  Londry
(Continued)

FOREIGN PATENT DOCUMENTS

EP   1416515 A2      5/2004
GB   2564666 A       1/2019
WO   2011/057415 A1  5/2011

OTHER PUBLICATIONS

Search Report under Section 17(5) for United Kingdom Patent Application No. GB1803773.9, dated Aug. 17, 2018, 4 pages.
International Search Report and Written Opinion for International Patent Application No. PCT/GB2019/050668, dated Jul. 29, 2019, 20 pages.
(Continued)

*Primary Examiner* — Kiet T Nguyen
(74) *Attorney, Agent, or Firm* — Goodwin Procter LLP (57) ABSTRACT

An ion confinement device (2) comprising: a plurality of electrodes arranged and configured for confining ions when an AC or RF voltage is applied thereto; and at least one inductive ballast (10a, 10b), each ballast connected to at least some of said electrodes so as to form a resonator circuit therewith.

20 Claims, 3 Drawing Sheets

(51) Int. Cl.
*H01J 49/02* (2006.01)
*H01J 49/24* (2006.01)
*H01J 49/42* (2006.01)
*H01J 37/32* (2006.01)

(52) U.S. Cl.
CPC .......... *H01J 49/022* (2013.01); *H01J 49/063* (2013.01); *H01J 49/24* (2013.01); *H01J 49/422* (2013.01); *H01J 49/4225* (2013.01)

(58) Field of Classification Search
CPC ................ H01J 49/063; H01J 49/4225; H01J 37/32174; G01N 27/622
USPC .................................................. 250/290, 292
See application file for complete search history.

(56) References Cited

U.S. PATENT DOCUMENTS

| | | |
|---|---|---|
| 2011/0278450 A1 | 11/2011 | Loucks et al. |
| 2012/0145892 A1 | 6/2012 | Gershman et al. |
| 2015/0228469 A1* | 8/2015 | Mizutani ............. H01J 49/4215 250/292 |
| 2017/0125229 A1 | 5/2017 | Giles et al. |

OTHER PUBLICATIONS

Wikipedia, "Electrical ballast", Jan. 24, 2018, Retrieved from the Internet: URL:https://en.wikipedia.org/w/index.php?title=Electrical_ballast&oldid=822193100 [retrieved on May 21, 2019].
Examination Report for United Kingdom Patent Application No. GB1803773.9, dated Mar. 1, 2022.

* cited by examiner

ION CONFINEMENT DEVICE

CROSS-REFERENCE TO RELATED APPLICATIONS

This application is a U.S. national phase filing under 35 U.S.C. § 371 claiming the benefit of and priority to International Patent Application No. PCT/GB2019/050668, filed on Mar. 11, 2019, which claims priority from and the benefit of United Kingdom patent application No. 1803773.9 filed on Mar. 9, 2018. and United Kingdom patent application No. 1721836.3, filed on Dec. 22, 2017. The entire contents of these applications are incorporated herein by reference.

FIELD OF THE INVENTION

The present invention relates generally to mass and/or ion mobility spectrometers and in particular to ion guides or ion traps for such spectrometers.

BACKGROUND

It is well known in mass spectrometry to confine ions along an axis by providing a series of electrodes on one side of the axis, providing an opposing series of electrodes on the opposite side of the axis, and applying AC or RF voltages to these electrodes so as to provide an electric field that confines the ions to the axis. For example, GB 2528152 discloses an ion mobility separator that radially confines ions between such opposing AC/RF electrodes. It is also known to provide a series of apertured electrodes, wherein the apertures of the electrodes are arranged along an axis, and apply AC or RF voltages to the electrodes such that ions are radially confined at the axis. At least some of the adjacent AC/RF electrodes may be maintained at AC or RF voltages having different phases. For example, stacked ring ion guides, ion tunnels or ion funnels are known that use such ion confinement techniques.

Such AC/RF electrodes are driven by a transformer having a primary coil connected to a power supply and a secondary coil connected to the AC/RF electrodes. In order to confine the desired ions, the AC/RF electrodes are required to be driven at certain frequencies and amplitudes. However, it has been found difficult to drive the AC/RF electrodes in the desired manner.

SUMMARY

An aspect of the present invention provides an ion confinement device comprising:

a plurality of electrodes arranged and configured for confining ions when an AC or RF voltage is applied thereto; and at least one inductive ballast, each ballast connected to at least some of said electrodes so as to form a resonator circuit therewith.

Each ballast is connected to the electrodes so as to provide a resonator circuit having a resonant frequency for confining the ions. The circuit desirably has a high Q-factor at the resonant frequency. This allows the ion confinement device to be driven by a low current. For example, the Q-factor may be ≥100; ≥120; ≥140; ≥160; ≥180; or ≥200 (at the resonant frequency).

The inventors have recognised that the combined capacitance of the electrodes in the ion confinement device can be relatively large, making it difficult to drive these electrodes. For example, the impedance of the capacitive load (at the AC/RF drive frequency) may be relatively low and so a high current is required. Embodiments of the present invention convert the capacitive load of the electrodes in the ion confinement device into a resonator, having a high Q-factor (at a specified frequency), that may therefore be driven by a relatively small current. Without the techniques described herein, a medium frequency driver similar to that used for a small medium-wave broadcasting station would be required to drive the electrodes in some ion confinement devices, causing significant heating of the connecting wires from the power supply to the electrodes of the ion confinement device.

Furthermore, in conventional ion guides it is desired for the resonant frequency of the circuit defined by the AC/RF electrodes and the secondary coil of the transformer to be set to a desired frequency for confining the ions. However, the resonant frequency is inversely proportional to the square-root of the product of the capacitance of the AC/RF electrodes and the inductance of the transformer secondary coil, and so the relatively large capacitance of the ion guide depresses the resonant frequency. It is difficult to reduce said capacitance or inductance to avoid this problem and so another solution is required. Embodiments of the present invention provide a ballast that shunts the inductance of the transformer secondary coil so as to reduce the inductance in the resonator circuit that includes the electrodes, thereby avoiding the resonant frequency of the resonator being depressed. It is therefore easier to achieve the ion confinement frequency.

The device may comprise a transformer having a primary coil for connection to a power supply and a secondary coil electrically connected to the electrodes for driving the electrodes.

The at least one ballast may be configured such that, in use, the peak or RMS current flowing through the ballast is greater than the peak or RMS current flowing through the secondary coil of the transformer.

The at least one ballast may have a lower inductance than the secondary coil of the transformer.

For example, the inductance of the at least one ballast may be lower than the inductance of the secondary coil of the transformer by a factor of: ≥2; ≥5; ≥10; ≥20; ≥30; 40; ≥50; ≥60; ≥70; ≥80; ≥100; ≥120; ≥140; ≥160; ≥180; or ≥200

Each of the at least one ballast may comprise an inductive coil.

Each of the at least one ballast may comprise at least one winding, a first connecting wire connecting a first end of the winding to at least one of the electrodes in the resonator circuit, a second connecting wire connecting a second end of the winding to at least one other of the electrodes in the resonator circuit; and wherein the first and/or second connecting wire has a length selected from: ≤50 cm; ≤40 cm; ≤30 cm; ≤25 cm; ≤20 cm; ≤15 cm; ≤14 cm; ≤13 cm; ≤12 cm; ≤10 cm; ≤9 cm; ≤8 cm; ≤7 cm; ≤6 cm; or ≤5.

This arrangement provides the connecting wires with a relatively low impedance and hence provides the resonator circuit with a relatively high Q-factor and low drive current requirement.

The device may comprise a plurality of said inductive ballasts, wherein different ones of the ballasts are connected to electrodes arranged in different, separate, regions of the ion confinement device so as to form resonator circuits therewith.

The use of multiple ballasts in this way enables the lengths of the connecting wires that extend between the ends of each ballast and the electrodes connected thereto to be minimised, hence minimising the impedance of these connecting wires and increasing the Q-factor of the resonator circuit in which each ballast is located.

The plurality of ballasts may be arranged with their longitudinal axes such that the magnetic flux from each of the ballasts enters at least one of the other ballasts.

For example, the plurality of ballasts may be arranged with their longitudinal axes substantially parallel to each other such that the magnetic flux from each of the ballasts enters at least one of the other ballasts. Alternatively, at least some of the plurality of ballasts may be arranged with their longitudinal axes at an angle (e.g. substantially orthogonal) to each other and such that the magnetic flux from each of the ballasts enters at least one of the other ballasts, e.g. three ballasts may be arranged with their longitudinal axes forming the sides of a triangle or four ballasts may be arranged with their longitudinal axes forming the sides of a square or rectangle.

First and second ballasts may be arranged with their longitudinal axes substantially parallel to each other, and the ballasts may be connected to the electrodes such that, in use, when a magnetic flux flows along the longitudinal axis of the first ballast in a first direction, a magnetic flux flows along the longitudinal axis of the second ballast in a second direction substantially opposite to the first direction.

The above-described circulation of the magnetic flux between the ballasts provides an improved Q-factor for the resonator circuits that include the ballasts and may also reduce electromagnetic interference with other electrical components.

The winding in the first ballast may be separated from the winding in the second ballast (e.g. in a direction perpendicular to the longitudinal axes of the ballasts) by a distance that is at least equal to the separation distance between the turns of one of the windings (in a direction parallel to the longitudinal axis of the ballast).

Although a pair of ballasts has been described, it is contemplated that three, four or more ballasts may be connected to the ion guide, e.g. in a linear array, a triangular array or a square array, etc.

The electrodes of the ion confinement device may be configured to confine ions along an elongated region having a longitudinal axis that is curved or angled so as to at least partially surround said at least one ballast.

When each of the at least one ballast is connected to multiple electrodes arranged along the length of the ion confinement device, such curved or angled embodiments decrease the distance of the one or more ballast from the electrodes of the device, and hence enable the lengths of connecting wires to be reduced, thereby increasing the Q-factor of the resonator circuit(s).

The ion confinement device may have a closed-loop ion guiding or closed-loop trapping region, and the at least one ballast may be arranged inside the closed-loop ion guiding or trapping region.

However, it is contemplated that the ion confinement device may confine ions along an elongated region having a longitudinal axis that is straight.

The at least one ballast may be located inside an electrically conductive chamber, such as a vacuum chamber, or inside electrical screening.

This electrically shields the at least one ballast so as to avoid the ballast causing electromagnetic interference with components outside of the chamber or screening.

The ion confinement device may be an ion guide or ion trap.

The techniques described herein are particularly useful in ion guides and ion traps, which are sometimes required to have relatively long ion confinement regions and hence many electrodes. The many electrodes in such devices provide a relatively high capacitance and so benefit from the techniques described herein. However, it is contemplated that the ion confinement device may be any other type of device in which an AC or RF voltage is applied to electrodes in order to confine at least some ions. For example, the device may be a mass filter.

Each of the at least one ballast may comprise at least one winding, wherein a first end of the winding is connected to a first set of said electrodes and a second end of the winding is connected to a second set of the electrodes, wherein electrodes in the first set of electrodes are interleaved with the electrodes in second set of electrodes such that at least some of the adjacent electrodes are connected to opposite ends of the winding.

For example, adjacent electrodes throughout the length of the ion confinement device may be connected to opposite ends of the winding or ballast.

Each of the at least one ballast may comprise: a plurality of windings would around its axis, a first set of connecting wires connecting the ends of the different windings at a first end of the ballast to respective different electrodes in a first set of the electrodes, and a second set of connecting wires connecting the ends of the different windings at a second end of the ballast to respective different electrodes in a second set of the electrodes.

The electrical connections may be connected so that the electrodes in the first set of electrodes are interleaved with the electrodes in second set of electrodes, such that at least some of the adjacent electrodes are connected to opposite ends of the ballast. Arranging multiple windings on the same ballast core saves space and also maintains a high Q-factor of the resonator circuits including the windings (as the total inductance of the ensemble approaches the inductance of any winding in isolation, rather than a fraction of it).

The plurality of windings in each ballast may be multifilar windings.

The first set of connecting wires may not be bound together and/or wherein the second set of connecting wires may not be bound together The device may comprise a power supply for providing different windings on each ballast with different DC offsets or for providing DC voltage pulses to the different windings at different times.

This enables different electrodes in the ion confinement device to be provided with different DC voltages. For example, a DC voltage supply may be connected to electrodes (via the windings on the ballast) for successively applying one or more DC voltage pulse to successive electrodes along the ion confinement device such that a travelling DC potential travels along the longitudinal path of the ion confinement device. Alternatively, the DC voltage supply may be configured to supply different DC offset voltages to successive electrodes (via the windings on the ballast) along the ion confinement device such that a static DC gradient is arranged along the ion confinement device. These embodiments may be useful, for example, if the ion confinement device is an ion guide in an ion mobility separator since the DC voltages may be used to drive ions through a gas in the ion mobility separator.

However, it is contemplated that the ion confinement device may be used in other types of instruments and may be provided in relatively high vacuum conditions.

The ion confinement device may comprise a power supply for providing the windings on each ballast with the same drive AC/RF waveform.

The different windings may be begun to be wound, at a first end of the ballast, at different points around the circumference of the first end of the ballast, and the different points may be spaced substantially evenly around the circumference of the first end of the ballast; and/or the different windings may be begun to be wound, at a second end of the ballast, at different points around the circumference of the second end of the ballast, and wherein the different points may be spaced substantially evenly around the circumference of the second end of the ballast.

The above-described spacing may equalise the voltage difference between adjacent coil turns and increase the Q-factor and/or symmetry of the resonators.

The device may comprise an AC or RF power supply coupled to the electrodes for driving the electrodes for confining the ions.

The provision of one or more ballasts also provides other advantages over conventional arrangements. For example, to obtain the proper frequency of operation, a conventional drive transformer has been required to have a low magnetizing inductance as seen from its secondary terminals. This requires the transformer core to have a large gap, resulting in high flux leakage and poor coupling. In contrast, in the embodiments of the present invention, the one or more ballast defines the impedance in the secondary circuit and so the gap in the transformer core may be reduced or removed. This enables lower flux leakage, better coupling and an increased magnetising inductance at the secondary terminals of the transformer.

Accordingly, the device may comprise a transformer having a primary coil for connection to a power supply and a secondary coil electrically connected to the electrodes, wherein the primary and/or secondary coil has no gap in its core.

Alternatively, the primary and/or secondary coil may have a gap in its core having a (radial) dimension of ≤x % of the magnetic path length (i.e. the mean path of the magnetic field around the ferrite core of the coil), wherein x is: 10, 9, 8, 7, 6, 5, 4, 3, 2 or 1.

From another aspect the present invention also provides an ion mobility separator or mass spectrometer comprising an ion confinement device as described herein.

The present invention also provides a method of confining ions comprising: providing an ion confinement device as described herein; and applying an AC or RF voltage to the electrodes.

The present invention also provides a method mass spectrometry and/or ion mobility spectrometry comprising the above-described method.

BRIEF DESCRIPTION OF THE DRAWINGS

Various embodiments will now be described, by way of example only, and with reference to the accompanying drawings in which.

DETAILED DESCRIPTION

Although the present disclosure is applicable to all devices having AC/RF ion confinement electrodes, embodiments will now be described in the context of an ion mobility separator (IMS) for illustrative purposes only.

Figure 1A:
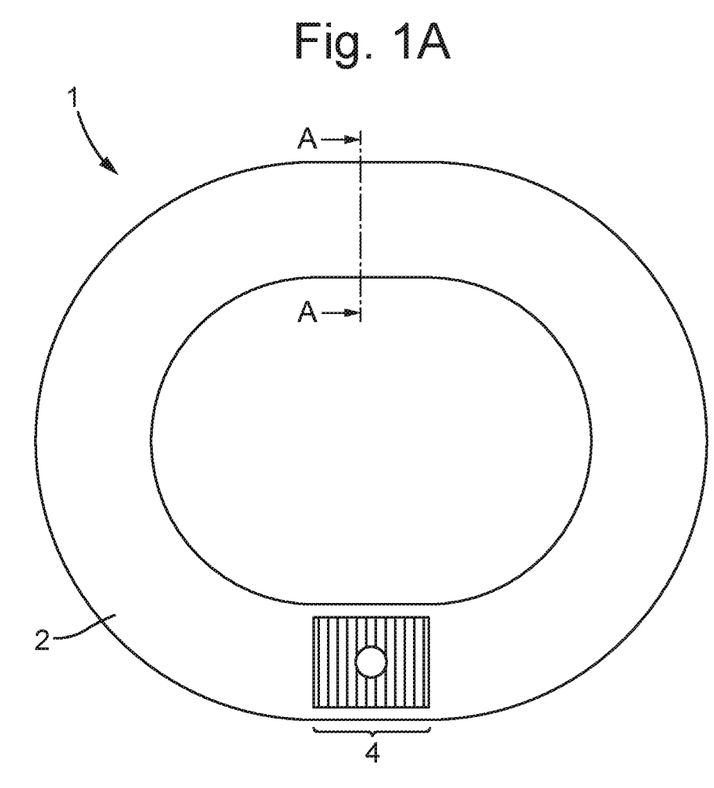
FIG. 1A shows a schematic of a plan view of an ion mobility separator (IMS) according to an embodiment of the present invention.

FIG. 1A shows a schematic of a plan view of an ion mobility separator (IMS) according to an embodiment of the present invention. The IMS device 1 comprises a closed-loop ion guide 2 having a closed-loop longitudinal path (i.e. circumferential path) around which the ions are guided in use. The ion guide 2 comprises a plurality of electrodes for radially confining the ions, i.e. in directions orthogonal to the longitudinal path. The electrodes of the ion guide 2 are also used for urging the ions along the longitudinal path. The device also has an ion entrance region and an ion exit region. The ion entrance and ion exit regions may be the same region 4, or may be different regions.

Figure 1B:
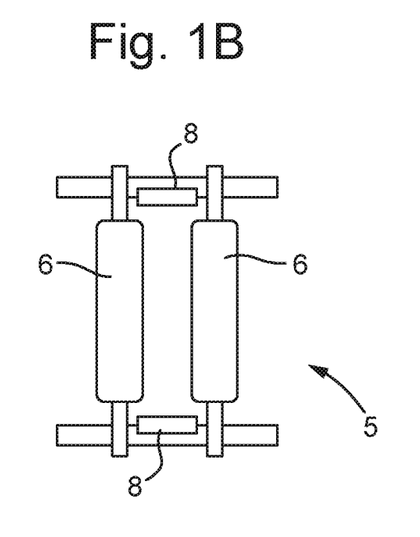
FIG. 1B shows a cross-sectional side view of a portion of the IMS device of FIG. 1A.

FIG. 1B shows a cross-sectional side view of a portion of the drift cell 2 of the IMS device of FIG. 1A, i.e. viewed along line A-A in FIG. 1A. FIG. 1B shows an embodiment of an electrode unit arrangement 5 that may be used to radially confine ions to the longitudinal path of the ion guide 2. At a given point along the axial length of the longitudinal path, the path may be defined between two AC or RF electrodes 6 that are spaced apart in a first direction and two DC electrodes 8 that are spaced in a second, optionally orthogonal, direction. The IMS device comprises an AC or RF voltage supply for supplying an AC or RF voltage to the RF electrodes 6, for confining the ions between the AC or RF electrodes 6, in the first direction. The IMS device also comprises a DC voltage supply for supplying DC voltages to the DC electrodes 8 so as to confine the ions between the DC electrodes 8, in the second direction. However, it is contemplated that alternatively the DC electrodes 8 may be replaced by AC or RF electrodes for confining the ions in the second direction.

The electrode unit 5 is repeated along the longitudinal path of the ion guide 2 for confining ions at all points around the ion guide 2, although the voltages applied may be altered to allow ions to be injected and ejected from the ion entry and ion exit region 4, respectively, which will be described further below. The series of electrode units 5 are arranged along the longitudinal path of the ion guide 2 and a DC voltage supply is connected to electrodes of the units 5 for successively applying one or more DC voltage to successive electrode units 5 such that a travelling DC potential travels along the longitudinal path of the ion guide 2. Alternatively, the DC voltage supply may be configured to supply different DC voltages to successive electrode units 5 around the ion guide 2 such that a static DC gradient is arranged along the longitudinal path of the ion guide 2.

The upper and lower opposing sides of the ion guide 2 (i.e. comprising electrodes 8), and/or the inner and outer opposing sides of the ion guide (i.e. comprising electrodes 6), may be formed from printed circuit boards having the electrodes 6,8 arranged thereon.

A mode of operation of the IMS device will now be described, by way of example only.

Ions may be introduced into the IMS device, e.g. at an ion entrance 4. AC/RF voltages are applied to AC/RF electrodes 6 by the AC/RF voltage supply so as to confine the ions between these electrodes. DC voltages are applied to DC electrodes 8 by the DC voltage supply so as to confine the ions between these electrodes. Alternatively, in the embodiments in which the electrodes 8 are RF electrodes, an AC/RF voltage supply supplies AC/RF voltages to electrodes 8 so as to confine the ions between these electrodes. The ions are therefore radially confined along the longitudinal path of the ion guide 2. In order to introduce the ions into the ion guide 2, the radial confinement voltages on some of the electrodes in the ion entrance region 4 may be switched off or reduced.

The DC voltage supply then applies different DC voltages to electrodes of different electrode units 5 so as to generate a DC voltage gradient along the longitudinal path, so as to urge ions along this path. A background or drift gas may be provided within the ion guide 2, which results in the ions being separated according to their ion mobilities through the gas as they are driven along the longitudinal path by the DC voltage gradient. The DC voltage gradient may be conveyed along the longitudinal path of the ion guide 2 as the ions move along this path, in an attempt to maintain the ions within the voltage gradient region so that the ions continue to separate as they move around the ion guide. As the ion guide 2 is closed-looped, the ions and voltage gradient may be cycled around the ion guide 2 a plurality of times and as many times as is necessary to provide the required overall length of drift for the ions, and thus the desired ion mobility resolution. After this, the ions may be extracted from the IMS device 2, e.g. at the same location as the ion entrance region 4, or at a different location. In order to extract the ions from the ion guide 2, the radial confinement voltages on some of the electrodes in the ion exit region 4 may be switched off or reduced, or the voltages on the electrodes in this region may be switched so as to provide an electric field that urges the ions in the radial direction and out of the ion guide 2.

Alternative embodiments are contemplated wherein the DC voltage supply successively applies one or more transient DC voltage to electrodes in successive electrode units 5 such that a transient DC potential moves along the longitudinal path of the ion guide 2. The transient DC potential may urge the ions along as it moves passed them. Ions of different mobilities may be urged by differing amounts by the DC potential as it passes them. The one or more DC potential may be repeatedly moved along the longitudinal path of the ion guide 2 such that it spatially separates the ions by mobility. This embodiment differs from that described above in that the ions need not remain within a DC voltage gradient in order to be spatially separated according to their ion mobility.

Although FIG. 1B shows electrodes 6,8 of certain configurations, it is contemplated that other configurations may be used. For example, different shaped electrodes may be used. Alternatively, rather than providing pairs of electrodes 6,8 in each electrode unit 5, the ion guide 2 may be formed by a series of apertured electrodes arranged with their apertures aligned along an axis for forming the longitudinal path, i.e. the ion guide may be an ion tunnel or ion funnel such as a stacked ring set of electrodes. RF voltages may be applied to the electrodes so as to radially confine the ions along the axis. For example, AC/RF voltages of different phases may be applied to adjacent electrodes, e.g. alternate electrodes may be supplied with opposite phases of an AC/RF voltage.

Although the ion guide has been described above as being a closed-loop ion guide, it is contemplated that the ion guide need not be closed-looped and may be open-ended.

Alternatively, or additionally, although the ion guide has been described as forming part of an IMS device, it is contemplated that the ion guide need not be part of an IMS device. For example, the ion guide may be maintained at high vacuum pressures.

Embodiments are contemplated wherein the DC voltage gradient is not provided along the longitudinal path, e.g. when the ion guide does not form part of an IMS device.

A transformer may be used to drive the AC/RF electrodes. The transformer may have a primary coil connected to a power supply for inducing a current in a secondary coil that is connected to the AC/RF electrodes.

In order to radially confine the ions in the ion guide, the AC/RF electrodes are required to be driven at a certain AC/RF voltage frequency and amplitude. By way of example only, in one application it is desired to drive the AC/RF electrodes at a frequency of 2.5 MHz and an amplitude of 250 V (peak-to-peak).

However, the inventors have recognised that it can be difficult to drive the AC/RF electrodes in the desired manner. More specifically, the inventors have recognised that the combined capacitance of the AC/RF electrodes in the ion guide can be relatively large (e.g. around 3 nF), making it difficult to drive these electrodes. For example, the impedance of the capacitive load (at the AC/RF drive frequency) may be relatively low and so a high current is required. Without the techniques described herein, a medium frequency driver similar to that used for a small medium-wave broadcasting station would be required to drive the AC/RF electrodes in some ion guides, causing significant heating of the connecting wires from the power supply to the electrodes of the ion confinement device.

Furthermore, in conventional systems it is desired for the resonant frequency of the circuit defined by the AC/RF electrodes and the secondary coil of the transformer to be set to a desired frequency for confining the ions. However, the resonant frequency is inversely proportional to the square-root of the product of the capacitance of the AC/RF electrodes and the inductance of the transformer secondary coil, and so the relatively large capacitance of the ion guide depresses the resonant frequency. It is difficult to reduce said capacitance or inductance to avoid the this problem and so another solution is required.

Embodiments of the present invention convert the capacitive load of the AC/RF electrodes in the ion guide into a resonator, having a high Q-factor (at a specified frequency), that may therefore be driven by a relatively small current. Various embodiments for increasing the Q-factor of the resonator and controlling the radiation of the electromagnetic interference are disclosed herein.

Embodiments of the present invention shunt the inductance of the transformer secondary coil so as to reduce the inductance in the resonator circuit that includes the AC/RF electrodes, thereby avoiding the resonant frequency of the resonator being depressed.

Figure 2:
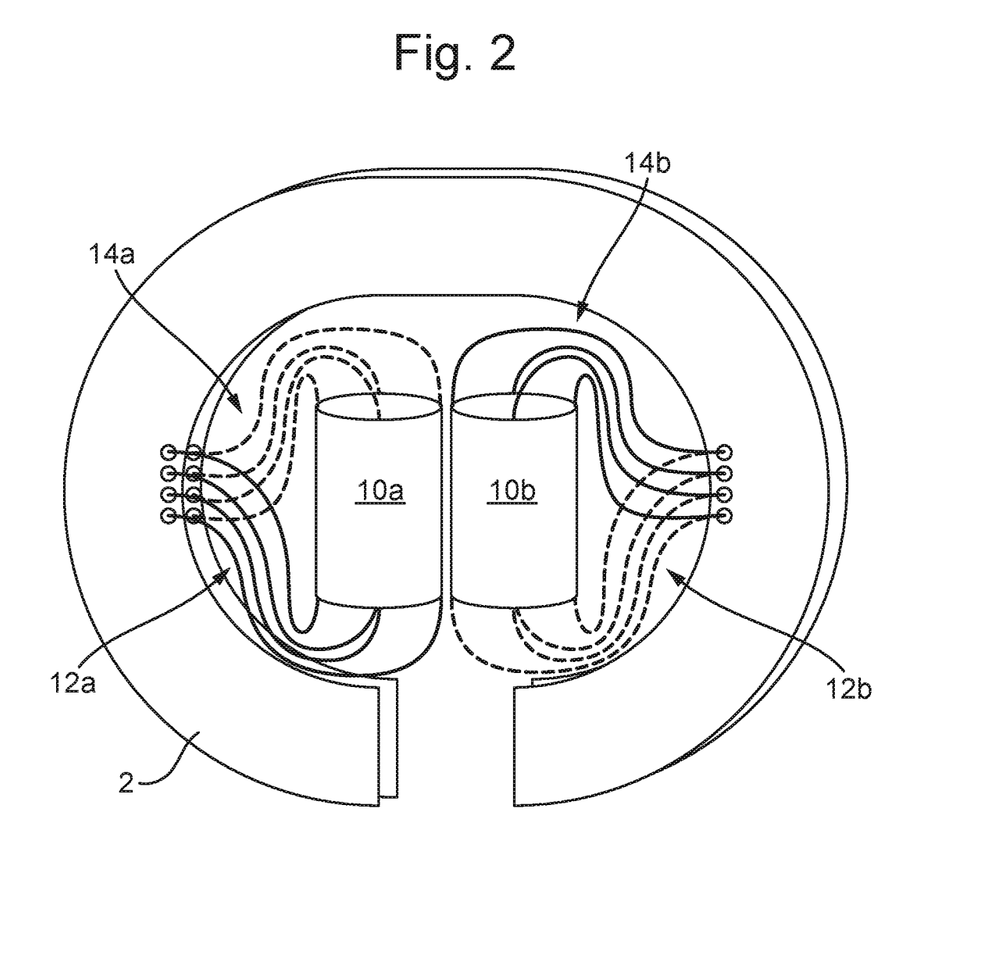
FIG. 2 shows a schematic of the IMS device of FIGS. 1A-1B, including two ballasts.

FIG. 2 shows a schematic of the ion guide 2 in FIGS. 1A-1B, except with the ion entrance/exit region 4 not shown. A transformer 7 may be used to drive the AC/RF electrodes, wherein the transformer has a primary coil connected to a power supply 9 and a secondary coil connected to the AC/RF electrodes. As shown in FIG. 2, an electrical ballast 10a in the form of an inductor is arranged within the closed-loop ion guide 2. The ballast 10a may comprise a single winding, or multiple windings, would around its axis. In the illustrated embodiment, the ballast 10a comprises four windings would around the axis. A first set of connecting wires 12a connect the ends of the windings at a first end of the ballast to a first set of the AC/RF electrodes 6, e.g. at the top side of the ion guide 2. A second set of connecting wires 14a connect the windings at a second end of the ballast 10a to a second set of the AC/RF electrodes 6, e.g. at the bottom side of the ion guide 2.

Desirably, the first set of connecting wires 12a are not bound together and/or the second set of connecting wires 14a are not bound together. The electrical connections may be connected so that the electrodes in the first set of electrodes are interleaved with the electrodes in second set of electrodes, such that at least some of the adjacent electrodes are connected to opposite ends of the ballast 10a. Adjacent electrodes throughout the ion guide 2 may be connected to opposite ends of the ballast 10a. This enables adjacent electrodes to be supplied with different phases of an AC/RF voltage signal.

Optionally, a second electrical ballast 10b in the form of an inductor may be arranged within the closed-loop ion guide 2. This second ballast 10b may comprise a single winding, or multiple windings, would around its axis. In the illustrated embodiment, the second ballast 10b comprises four windings would around the axis. A third set of connecting wires 12b connect the windings at the one end of the ballast 10b to the second set of AC/RF electrodes 6, e.g. at the bottom of the ion guide 2. A fourth set of connecting wires 14b connect the ends of the windings at the other end of ballast 10b to the first set of AC/RF electrodes 6, e.g. at the top of the ion guide 2.

As the AC/RF electrodes provide a capacitance in use, each circuit comprising a ballast 10 (i.e. inductor) and the AC/RF electrodes connected thereto forms a resonator in the form of an LC circuit. In operation, the AC/RF electrodes are driven by an AC/RF voltage supply, through the transformer, causing charge to build up on adjacent AC/RF electrodes due to their capacitance. This charge difference causes a current to flow from one electrode to the another electrode, via the associated ballast 10. The current flowing through the ballast 10 generates a magnetic field that resists the flow of current in this direction and urges the charge to flow in the opposite direction. The circuit acts as a resonator because energy alternates from being stored in an electric field as the capacitor formed by the AC/RF electrodes is charged, and in a magnetic field as current flows through the ballast 10. The ballast 10 is connected to the AC/RF electrodes so as to provide a resonator having a resonant frequency suitable for confining the ions.

The ballast 10 is configured such that, in use, the majority of the load current flows through the ballast 10, i.e. as opposed to flowing through the secondary coil of the transformer that is connected to the same AC/RF electrodes. For example, the current flowing through the ballast 10 may be around 1 A, whereas the current in the secondary coil of the transformer may be around 100 mA. The ballast 10 may be an inductive shunt, provided in parallel with the output of the transformer, so as to shunt the transformer inductance. The ballast 10 therefore controls of the impedance in the resonator circuit and hence the operating frequency of the AC/RF electrodes used to confine the ions.

The embodiments provide a resonator having a relatively high Q-factor such that the rate of energy loss relative to the stored energy is relatively low, i.e. the oscillations have low damping. This enables the AC/RF electrodes to be driven by a relatively small current. Desirably, the Q-factor may be 100; 120; 140; 160; 180; or 200.

Various embodiments for increasing the Q-factor of the resonator are disclosed herein. For example, each of the one or more ballasts 10a,10b may be located relatively close to the AC/RF electrodes of the ion guide 2 so as to minimize the impedance of the connecting wires 12a,12b,14a,14b. At least some of the connecting wires 12a,12b,14a,14b that connect the ends of the ballast 10a,10b to the AC/RF electrodes may each have a length selected from: ≤50 cm; ≤40 cm; ≤30 cm; ≤25 cm; ≤20 cm; ≤15 cm; ≤14 cm; ≤13 cm; ≤12 cm; ≤10 cm; ≤9 cm; ≤8 cm; ≤7 cm; ≤6 cm; or ≤5.

As described above, one or more electrical ballast 10a, 10b may be connected to the AC/RF electrodes of the ion guide 2. Where a plurality of ballasts 10a,10b are provided, different ballasts may be connected to the AC/RF electrodes arranged in different, separate lengths of the ion guide 2. This enables the lengths of the connecting wires that extend between the ends of each ballast and the AC/RF electrodes to be minimised, hence minimising the impedance of the connecting wires and increasing the Q-factor of the resonator circuit.

Figure 3:
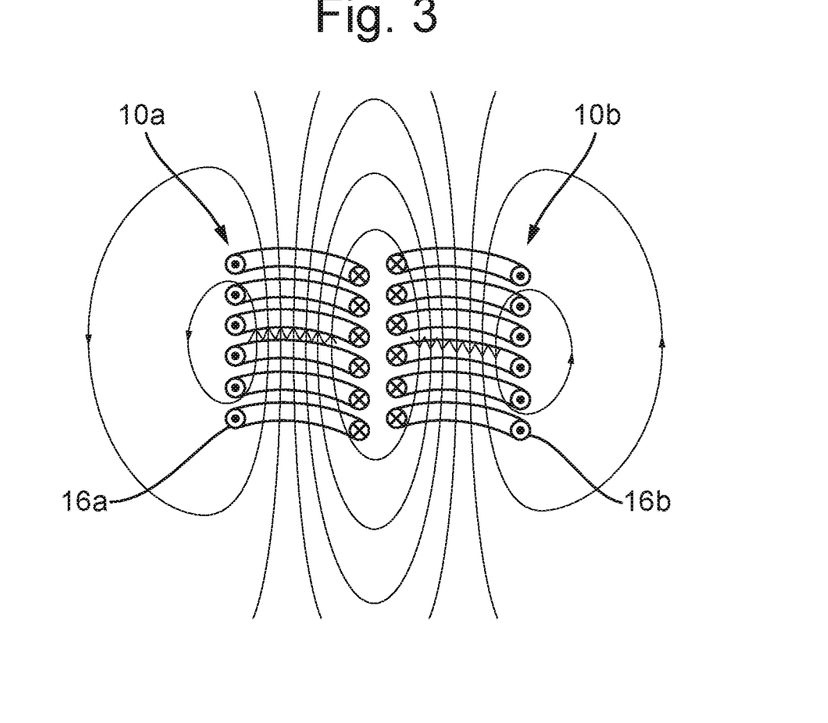
FIG. 3 shows the coils in the ballasts of FIG. 2 and the magnetic field lines they generate in use.

At least two ballasts 10a,10b may be provided, wherein the ballasts are arranged with their longitudinal axes substantially parallel to each other and such that the magnetic flux from each of the ballasts enters at least one of the other ballasts. The ballasts 10a,10b may be arranged in pairs and their ends connected to polarities such that the magnetic flux generated by each ballast in the pair enters the other ballast in the pair, e.g. as shown in FIG. 3. FIG. 3 shows the magnetic field lines generated by the ballasts 10a,10b in use and the directions of the currents 16a,16b in the ballasts. As can be see, when a magnetic flux flows along the longitudinal axis of the first ballast 10a in a first direction, a magnetic flux flows along the longitudinal axis of the second ballast 10b in a second direction substantially opposite to the first direction. The above-described circulation of the magnetic flux between the ballasts 10a,10b provides an improved Q-factor for the resonator circuits that include the ballasts and may also reduce electromagnetic interference with other electrical components.

The winding in the first ballast 10a may be separated from the winding in the second ballast 10b (e.g. in a direction perpendicular to the longitudinal axes of the ballasts) by a distance that is at least equal to the separation distance between the turns of one of the windings (in a direction parallel to the longitudinal axis of the ballast).

Although pairs of ballasts 10a,10b have been described, it is contemplated that three, four or more ballasts may be connected to the ion guide, e.g. in a linear array, a triangular array or a square array, etc. and having the same winding sense in each coil so as to circulate the flux and provide an improved Q-factor and/or reduced electromagnetic interference. For greatest efficiency, an even number of ballasts may be provided, with opposite flux directions between adjacent ballasts.

The windings of the multiple ballasts 10a,10b may be electrically connected in series or in parallel.

The ion guide 2 may be a straight ion guide for guiding the ions in a straight line. Alternatively, the ion guide 2 may be a curved or angled ion guide, such as a closed-loop ion guide, for guiding ions along a curved or angled path. In embodiments where the ion guide 2 is curved or angled, the AC/RF electrodes may be arranged such that the longitudinal axis of the ion guiding path is curved or angled to extend around the one or more ballasts 10a,10b. For example, in a closed-loop ion guide 2 the one or more ballasts 10a,10b may be arranged inside the closed-loop. Such arrangements decrease the distance of the ballast from the AC/RF electrodes and hence enable the lengths of connecting wires 12a,12b,14a,14b to be reduced, thereby increasing the Q-factor of the resonator.

The one or more ballast 10a,10b may be located inside of an electrically conductive chamber or inside another form of electrical screening. For example, the ballast (and ion guide) may be located inside of a vacuum chamber 13 (FIG. 2). This electrically shields the ballast so as to avoid the ballast causing electromagnetic interference with components outside of the chamber or screening.

As described above, each of the one or more ballasts 10a,10b may have at least one winding wound thereon. The ends of the different windings may be connected to different AC/RF electrodes by the connecting wires 12a,12b,14a,14b. Arranging multiple windings on the same ballast core saves space and also maintains a high Q-factor of the resonator circuits including the windings (as the total inductance of the ensemble approaches the inductance of any winding in isolation, rather than a fraction of it).

The windings on each ballast 10 may be provided with the same drive AC/RF waveform, but may optionally have different DC and/or low-frequency RF signal components. For example, the different windings 16 on a ballast may be provided with different DC offsets or DC voltage pulses may be applied to the different windings at different times. This enables different electrodes in the ion guide 2 to be provided with different DC voltages. For example, as described above, a DC voltage supply may be connected to electrodes (via the windings on the ballast) for successively applying one or more DC voltage to successive electrodes such that a travelling DC potential travels along the longitudinal path of the ion guide 2. Alternatively, the DC voltage supply may be configured to supply different DC voltages to successive electrodes (via the windings on the ballast) around the ion guide 2 such that a static DC gradient is arranged along the longitudinal path of the ion guide 2.

Where multiple windings 16 are wound on each ballast 10, the different points at which the different windings are begun to be wound, at a first end of the ballast 10, may be spaced apart around the circumference of the first end of the ballast. Optionally, the different points at which the different windings are begun to be wound may be spaced substantially evenly around the circumference of the first end of the ballast 10. Alternatively, or additionally, the different points at which the different windings are begun to be wound, at a second end of the ballast 10, may be spaced apart around the circumference of the second end of the ballast. Optionally, the different points at which the different windings are begun to be wound may be spaced substantially evenly around the circumference of the second end of the ballast 10. The above-described spacing may equalise the voltage difference between adjacent coil turns and increase the Q-factor of the resonators.

Figure 4:
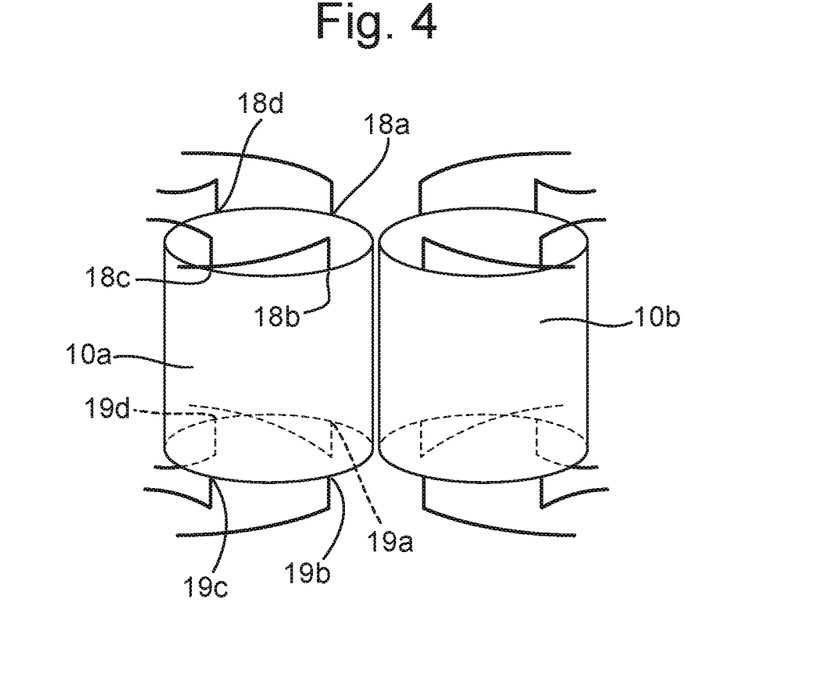
FIG. 4 shows a schematic of the pair of ballasts in FIG. 2, for an embodiment in which each ballast has four coils wound thereon.

FIG. 4 shows a schematic of the pair of ballasts 10a,10b in FIGS. 2 and 3, wherein each ballast 10 has four windings wound thereon (turns not shown). It can be seen that in this embodiment the points 18a-18d at which the different windings are begun to be wound, at a first end of the ballast 10, are spaced apart substantially evenly around the circumference of the first end of the ballast. Similarly, the points 19a-19d at which the different windings are begun to be wound at the second, opposite end of the ballast 10 are spaced apart substantially evenly around the circumference of the second end.

The provision of one or more ballasts 10 also provides other advantages over conventional arrangements. For example, to obtain the proper frequency of operation, a conventional drive transformer has been required to have a low magnetizing inductance as seen from its secondary terminals. This requires the transformer core to have a large gap, resulting in high flux leakage and poor coupling. In contrast, in the embodiments of the present invention, the one or more ballast 10 defines the impedance in the secondary circuit and so the gap in the transformer core may be reduced or removed. This enables lower flux leakage, better coupling and an increased magnetising inductance at the secondary terminals of the transformer.

Although the present invention has been described with reference to preferred embodiments, it will be understood by those skilled in the art that various changes in form and detail may be made without departing from the scope of the invention as set forth in the accompanying claims.

For example, although examples of AC/RF drive frequencies and amplitudes have been described above, other frequencies and amplitudes may be used. It is contemplated that embodiments of the invention can be used with a variety of frequencies, such those in the medium-frequency band, the high-frequency band or the very high-frequency band.

Although ion guides have been described in the embodiments above, it is contemplated that the embodiments of invention may be used with AC/RF electrodes of other devices. For example, embodiments of the invention may be used in an ion trap having AC/RF electrodes for confining ions. The ion trap may function in the manner described with respect to the ion guide in the above embodiments, although in the ion trap the ions are confined in three dimensions and need not necessarily be urged along the ion trap. For example, AC/RF electrodes may be used to confine the ions in one, two or three dimensions within the ion guide and one or more ballast may be connected to these AC/RF electrodes in the manner described herein. DC electrodes may be used to confine ions in one or more dimensions within the ion trap. It is also contemplated that the ion trapping region of the ion trap may be elongated (e.g. a linear ion trap) or not.

The invention claimed is:

1. An ion confinement device comprising:
   a plurality of electrodes arranged and configured for confining ions when an AC or RF voltage is applied thereto; and
   at least one inductive ballast, each ballast connected to at least some of said electrodes so as to form a resonator circuit therewith.

2. The device of claim 1, further comprising a transformer having a primary coil for connection to a power supply and a secondary coil electrically connected to the electrodes for driving the electrodes.

3. The device of claim 2, wherein the at least one ballast is configured such that, in use, the peak or RMS current flowing through the ballast is greater than the peak or RMS current flowing through the secondary coil of the transformer.

4. The device of claim 2, wherein the at least one ballast has a lower inductance than the secondary coil of the transformer.

5. The device of claim 1, wherein each of the at least one ballast comprises at least one winding, a first connecting wire connecting a first end of the winding to at least one of the electrodes in the resonator circuit, a second connecting wire connecting a second end of the winding to at least one other of the electrodes in the resonator circuit; and wherein the first and/or second connecting wire has a length selected from: ≤50 cm; ≤40 cm; ≤30 cm; ≤25 cm; ≤20 cm; ≤15 cm; ≤14 cm; ≤13 cm; ≤12 cm; ≤10 cm; ≤9 cm; ≤8 cm; ≤7 cm; ≤6 cm; or ≤5.

6. The device of claim 1, comprising a plurality of said inductive ballasts, wherein different ones of the ballasts are connected to electrodes arranged in different, separate, regions of the ion confinement device so as to form resonator circuits therewith.

7. The device of claim 6, wherein the plurality of ballasts are arranged with their longitudinal axes such that the magnetic flux from each of the ballasts enters at least one of the other ballasts.

8. The device of claim 7, wherein first and second ballasts are arranged with their longitudinal axes substantially parallel to each other, and the ballasts are connected to the electrodes such that, in use, when a magnetic flux flows along the longitudinal axis of the first ballast in a first direction, a magnetic flux flows along the longitudinal axis of the second ballast in a second direction substantially opposite to the first direction.

9. The device of claim 1, wherein the electrodes of the ion confinement device are configured to confine ions along an elongated region having a longitudinal axis that is curved or angled so as to at least partially surround said at least one ballast.

10. The device of claim 1, wherein the ion confinement device has a closed-loop ion guiding or closed-loop trapping region, and wherein the at least one ballast is arranged inside the closed-loop ion guiding or trapping region.

11. The device of claim 1, wherein the at least one ballast is located inside an electrically conductive chamber, such as a vacuum chamber, or inside electrical screening.

12. The device of claim 1, wherein the ion confinement device is an ion guide or ion trap.

13. The device of claim 1, wherein each of the at least one ballast comprises at least one winding, wherein a first end of the winding is connected to a first set of said electrodes and a second end of the winding is connected to a second set of the electrodes, wherein electrodes in the first set of electrodes are interleaved with the electrodes in second set of electrodes such that at least some of the adjacent electrodes are connected to opposite ends of the winding.

14. The device of claim 1, wherein each of the at least one ballast comprises: a plurality of windings would around its axis, a first set of connecting wires connecting the ends of the different windings at a first end of the ballast to respective different electrodes in a first set of the electrodes, and a second set of connecting wires connecting the ends of the different windings at a second end of the ballast to respective different electrodes in a second set of the electrodes.

15. The device of claim 14, wherein the first set of connecting wires are not bound together and/or wherein the second set of connecting wires are not bound together.

16. The device of claim 14, comprising a power supply for providing different windings on each ballast with different DC offsets or for providing DC voltage pulses to the different windings at different times.

17. The device of claim 14, wherein the different windings are begun to be wound, at a first end of the ballast, at different points around the circumference of the first end of the ballast, and wherein the different points are spaced substantially evenly around the circumference of the first end of the ballast; and/or wherein the different windings are begun to be wound, at a second end of the ballast, at different points around the circumference of the second end of the ballast, and wherein the different points are spaced substantially evenly around the circumference of the second end of the ballast.

18. The device of claim 14, comprising an AC or RF power supply coupled to the electrodes for driving the electrodes for confining the ions.

19. The device of claim 14, comprising a transformer having a primary coil for connection to a power supply and a secondary coil electrically connected to the electrodes, wherein the primary and/or secondary coil has no gap in its core.

20. An ion mobility separator or mass spectrometer comprising an ion confinement device as claimed in claim 14.

* * * * *